United States Patent
Caffee et al.

(10) Patent No.: US 10,601,431 B2
(45) Date of Patent: Mar. 24, 2020

(54) TIME-TO-VOLTAGE CONVERTER USING CORRELATED DOUBLE SAMPLING

(71) Applicant: Silicon Laboratories Inc., Austin, TX (US)

(72) Inventors: Aaron J. Caffee, Scappoose, OR (US); Jeffrey L. Sonntag, Austin, TX (US); Brian G. Drost, Corvallis, OR (US); Volodymyr Kratyuk, Hillsboro, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/022,188

(22) Filed: Jun. 28, 2018

(65) Prior Publication Data
US 2020/0007136 A1    Jan. 2, 2020

(51) Int. Cl.
*H03M 1/06* (2006.01)
*G04F 10/00* (2006.01)
*H03K 5/24* (2006.01)

(52) U.S. Cl.
CPC ............ *H03M 1/06* (2013.01); *G04F 10/005* (2013.01); *H03K 5/24* (2013.01)

(58) Field of Classification Search
CPC ............ H03M 1/06; G04F 10/005; H03K 5/24
USPC .......................................... 341/118, 120, 144
See application file for complete search history.

(56) References Cited

U.S. PATENT DOCUMENTS

| | | | |
|---|---|---|---|
| 3,676,661 A * | 7/1972 | Sprowl | G06G 7/161 708/838 |
| 4,584,489 A * | 4/1986 | Tanaka | H03K 5/15066 327/100 |
| 5,659,314 A | 8/1997 | Tokura | |
| 7,417,510 B2 | 8/2008 | Huang | |
| 8,283,933 B2 * | 10/2012 | Dasnurkar | G01R 29/26 324/555 |
| 8,462,840 B2 | 6/2013 | Chen | |
| 8,503,597 B2 | 8/2013 | Fischette | |

(Continued)

OTHER PUBLICATIONS

Alahdab, S. et al., "A 12-Bit Digital-to-Time Converter (DTC) with sub-ps-level resolution using current DAC and differential switch for Time-to-Digital Converter (TDC)," IEEE International Instrumentation and Measurement Technology Conference (I2MTC), May 13-16, 2012, pp. 2668-2671.

(Continued)

*Primary Examiner* — Brian K Young
(74) *Attorney, Agent, or Firm* — Zagorin Cave LLP

(57) ABSTRACT

A time-to-voltage converter is configured to generate an output voltage signal and a correlated reference voltage signal. The time-to-voltage converter includes a current source configured to generate a bias current through a current source output node. The time-to-voltage converter includes a first switched-capacitor circuit coupled to the current source output node and configured to generate the output voltage signal based on an input time signal and the bias current during a first interval. The time-to-voltage converter includes a second switched-capacitor circuit coupled to the current source output node and configured to generate the correlated reference voltage signal based on a reference time signal and the bias current during a second interval. The first interval and the second interval are non-overlapping intervals.

20 Claims, 9 Drawing Sheets

(56) References Cited

U.S. PATENT DOCUMENTS

| | | |
|---|---|---|
| 8,531,246 B2 | 9/2013 | Huang |
| 8,669,810 B2 | 3/2014 | Kwon |
| 8,692,599 B2 | 4/2014 | Gong et al. |
| 8,736,476 B2 | 5/2014 | Gong et al. |
| 8,994,573 B2 | 3/2015 | Henzler |
| 9,007,251 B2 | 4/2015 | Perthold |
| 9,071,304 B2 | 6/2015 | Banin |
| 9,137,084 B2 | 9/2015 | Degani |
| 9,209,958 B1 | 12/2015 | Palaskas |
| 9,362,936 B1 | 6/2016 | Caffee et al. |
| 9,379,879 B1 | 6/2016 | Caffee et al. |
| 9,531,394 B1 | 12/2016 | Caffee et al. |
| 2004/0174286 A1 | 9/2004 | Donovan |
| 2011/0156783 A1 | 6/2011 | Pavlovic |
| 2014/0002288 A1 | 1/2014 | Scholz |
| 2014/0176201 A1 | 6/2014 | Weltin-Wu |
| 2015/0145567 A1 | 5/2015 | Perrott |
| 2015/0145569 A1 | 5/2015 | Perrott |
| 2015/0145570 A1 | 5/2015 | Perrott |
| 2015/0145571 A1 | 5/2015 | Perrott |

OTHER PUBLICATIONS

Enz, C. and Temes, G., "Circuit Techniques for Reducing the Effects of Op-Amp Imperfections: Autozeroing, Correlated Double Sampling, and Chopper Stabilization," Proceedings of the IEEE, vol. 84, No. 11, Nov. 1996, pp. 1584-1614.

Liu, H., et al., "A 0.98mW Fractional-N ADPLL Using 10b Isolated Constant-Slope DTC with FOM of −246dB for IoT Applications in 65nm CMOS," ISSCC 2018, Session 15, RF PLLs/ 15.1, 2018, pp. 246-248.

Ru, J., et al., "A High-Linearity Digital-to-Time Converter Technique: Constant-Slope Charging," IEEE Journal of Solid-State Circuits, vol. 50, No. 6, Jun. 2015, pp. 1412-1423.

\* cited by examiner

TIME-TO-VOLTAGE CONVERTER USING CORRELATED DOUBLE SAMPLING

BACKGROUND

Field of the Invention

This application is related to signal converters and more particularly to signal conversion using time-to-voltage converters.

Description of the Related Art

In general, a time-to-voltage converter measures an interval of time between events, e.g., a time between a rising edge of a signal and a falling edge of the signal. Integrated circuit applications use time-to-voltage converter circuits in time-to-digital converters and digital-to-time converters. A typical time-to-voltage converter charges a capacitor during an interval of interest to generate an output voltage that is linearly related to the interval. That output voltage may be measured using an analog-to-digital converter of a time-to-digital converter or may be compared to a predetermined threshold voltage by a comparator of a digital-to-time converter.

Referring to FIGS. 1-3, time-to-digital converter 100 includes phase detector 102, which generates signal SLEW that represents the difference between a phase of a start event (e.g., a rising edge of signal START) and a phase of a stop event (e.g., a rising edge of output time signal STOP). Time-to-voltage converter 104 charges capacitor 302 during the interval being measured (e.g., input interval $t_{in}$ of signal SLEW, which represents the phase difference between signal START and output time signal STOP). Initially, signal SLEW and signal RESET configure time-to-voltage converter 104 in a reset interval (e.g., RESET='1' and SLEW='0') during which capacitor 302 discharges to a reset voltage (e.g., 0 V). A start event (e.g., a rising edge of signal SLEW) causes time-to-voltage converter 104 to enter a charging interval. During the charging interval (e.g., RESET '0' and SLEW '1'), time-to-voltage converter 104 charges capacitor 302 using current source 306, which provides constant current $I_{SLEW}$ to capacitor 302, causing voltage $v_{OUT}$ to increase linearly with time. At the end of the charging interval, a stop event (e.g., a falling edge of signal SLEW) causes time-to-voltage converter 104 to enter a hold interval and to disconnect capacitor 302 from current source 306, which stops the charging. The reset interval, charging interval, and hold interval typically repeat periodically in response to START, STOP, and RESET being periodic. Time-to-voltage converter 104 provides voltage $v_{OUT}$ to analog-to-digital converter 106, which is a conventional voltage-mode analog-to-digital converter that generates digital output code $D_{OUT}$ based on output voltage $v_{OUT}$ received from time-to-voltage converter 104 and a voltage reference signal $v_{REF,ADC}$.

Referring to FIGS. 4-6, digital-to-time converter 400 generates output signal STOP having a time delay with respect to input signal START that is programmable by input digital code $D_{IN}$. Digital-to-analog converter 402 uses reference voltage $v_{REF,DAC}$ to generate analog signal IN having a voltage level that corresponds to input digital code $D_{IN}$. Time-to-voltage converter 404 uses the voltage level provided by digital-to-analog converter 402 as an initial capacitor voltage level for capacitor 602. Time-to-voltage converter 404 charges capacitor 602 to the voltage level indicated by VIN during a reset interval (e.g., signal RESET='1' and signal START='0'). A start event (e.g., a rising edge of signal START) causes time-to-voltage converter 404 to enter a charging interval (e.g., RESET='0' and SLEW='1') to charge capacitor 602 using current source 306, which provides constant current $I_{SLEW}$ to cause voltage $v_{OUT}$ across capacitor 602 to increase linearly with time. Time-to-voltage converter 404 provides voltage $v_{OUT}$ to comparator 406, which is a conventional comparator circuit. Comparator 406 detects when voltage $v_{OUT}$ crosses a threshold voltage level and generates a transition (e.g., a rising edge) of output time signal STOP. The delay between the rising edge of signal START and a corresponding rising edge of output time signal STOP is, under ideal conditions, linearly related to the level of input digital code $D_{IN}$. The reset interval, charging interval, and hold interval typically repeat periodically.

Time-to-digital converter 100 and digital-to-time converter 400 each use charging intervals of time that guarantee linear operation. For example, a minimum charging interval is defined by the current source switching speed and a maximum time interval is defined by the voltage required across the current source to ensure sufficiently high output impedance. In general, current sources generate substantial noise due to a relatively low overdrive voltage. Such designs in applications that require accurate measurement of a relatively fixed time interval are susceptible to flicker noise. In addition, the gain of time-to-digital converter 100 and digital-to-time converter 400 may be sensitive to variations in manufacturing process, temperature, strain, and/or aging, which may impact performance of an application including those circuits. Accordingly, improved techniques for signal conversion using time-to-voltage converters are desired.

SUMMARY OF EMBODIMENTS OF THE INVENTION

In at least one embodiment of the invention, an apparatus includes a time-to-voltage converter configured to generate an output voltage signal and a correlated reference voltage signal. The time-to-voltage converter includes a current source configured to generate a bias current through a current source output node. The time-to-voltage converter includes a first switched-capacitor circuit coupled to the current source output node and configured to generate the output voltage signal based on an input time signal and the bias current during a first interval. The time-to-voltage converter includes a second switched-capacitor circuit coupled to the current source output node and configured to generate the correlated reference voltage signal based on a reference time signal and the bias current during a second interval. The first interval and the second interval are non-overlapping intervals. The apparatus may include a phase detector configured to generate the input time signal indicative of an input interval. The apparatus may include an analog-to-digital converter configured to generate a digital code corresponding to the output voltage signal using the correlated reference voltage signal. The phase detector, the time-to-voltage converter, and the analog-to-digital converter may be configured as a time-to-digital converter. The apparatus may include a digital-to-analog converter configured to use the correlated reference voltage signal to generate the input time signal in response to an input digital code and a reference time signal. The apparatus may include a comparator configured to generate an output time signal in response to a comparison of the output voltage signal and a threshold voltage level of the comparator. The time-tovoltage converter, the digital-to-analog converter, and the comparator may be configured as a digital-to-time converter.

In at least one embodiment of the invention, a method includes generating a bias current and generating an output voltage signal that is linearly related to an input time signal based on the bias current during a first interval. The method includes generating a correlated reference voltage signal. Generation of the correlated reference voltage signal includes sampling the bias current during a second interval to generate a bias current sample. Generation of the correlated reference voltage signal includes updating the correlated reference voltage signal using the bias current sample to generate the correlated reference voltage signal. The first interval and the second interval are non-overlapping intervals. The method may include converting an input interval between a time representation and a digital signal representation based on the output voltage signal and the correlated reference voltage signal.

In at least one embodiment of the invention, a data converter includes a time-to-voltage converter configured to generate an output voltage signal in response to an input interval and a correlated reference voltage signal in response to a reference interval. The data converter is a time-to-digital converter or a digital-to-time converter. If the data converter is the time-to-digital converter, the data converter further includes a phase detector configured to generate the input interval in response to a first input signal and a second input signal and an analog-to-digital converter configured to generate a digital code corresponding to the output voltage signal using the correlated reference voltage signal. If the data converter is the digital-to-time converter, the data converter further includes a digital-to-analog converter configured to use the correlated reference voltage signal to generate the input interval in response to an input digital code and an input time signal and a comparator configured to generate an output time signal in response to a comparison of the output voltage signal and a threshold voltage level of the comparator.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
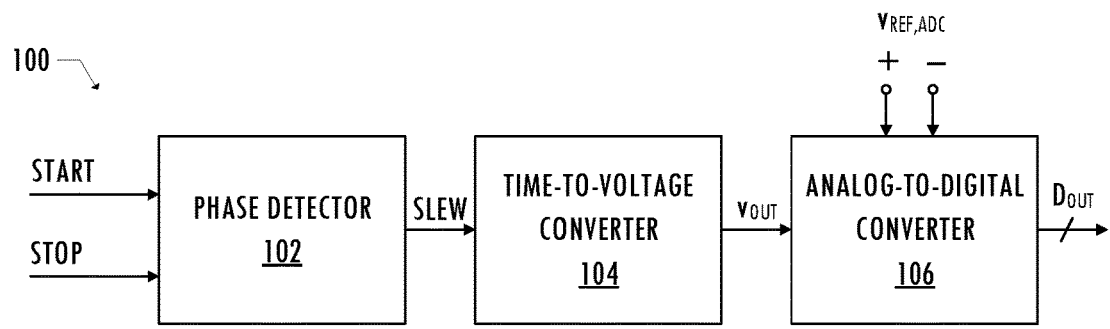
FIG. 1 illustrates a functional block diagram of a conventional time-to-digital converter.
Figure 2:
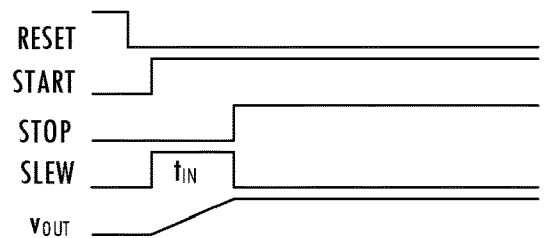
FIG. 2 illustrates exemplary waveforms for the conventional time-to-digital converter of FIG. 1.
Figure 3:
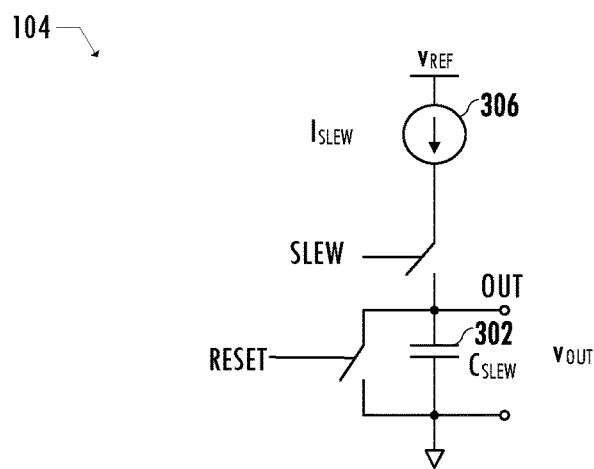
FIG. 3 illustrates a circuit diagram of an exemplary time-to-voltage converter of the conventional time-to-digital converter of FIG. 1.

Referring to FIGS. 1-3, a time difference between a first edge of voltage $v_{OUT}$ (e.g., rising edge of voltage $v_{OUT}$) and a second edge of voltage $v_{OUT}$ (e.g., falling edge of voltage $v_{OUT}$) indicates an output time delay corresponding to an input interval indicated by signal START and signal STOP. Ideally, voltage $v_{OUT}$ is proportional to input interval $t_{in}$ (indicated by the start event and the stop event and reflected by a pulse of signal SLEW):

$$v_{OUT} = t_{IN} \times I_{SLEW}/C_{SLEW}.$$

During a hold interval (e.g., RESET='0' and SLEW='0'), time-to-voltage converter 104 holds voltage $v_{OUT}$, as needed. Analog-to-digital converter 106 is a conventional voltage-mode analog-to-digital converter that generates digital output code $D_{OUT}$ based on input voltage $v_{IN}$ provided to the analog-to-digital converter as follows:

$$D_{OUT} = \frac{v_{IN}}{v_{REF,ADC}} 2^{N_{ADC}} + \varepsilon_q,$$

where $v_{REF,ADC}$ is a reference voltage provided to analog-to-digital converter 106, $N_{ADC}$ is the number of bits of digital output code $D_{OUT}$, and $\varepsilon_q$ is the quantization error. Since time-to-voltage converter 104 provides voltage $v_{OUT}$ and input voltage $v_{IN}$ to analog-to-digital converter 106, the relationship becomes:

$$D_{OUT} = t_{IN} \frac{I_{SLEW}}{C_{SLEW} v_{REF,ADC}} 2^{N_{ADC}} + \varepsilon_q.$$

Note that the gain of time-to-digital converter 100 is defined by current $I_{SLEW}$ and reference voltage $v_{REF,ADC}$.

Figure 7:
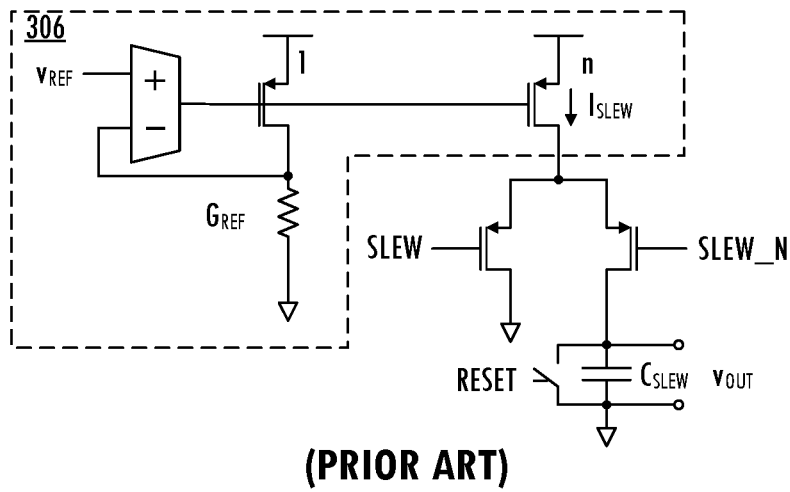
FIG. 7 illustrates a circuit diagram of an exemplary time-to-voltage converter including a conventional current source of the conventional time-to-digital converter of FIG. 1.

Current source 306 is a conventional current source, as illustrated in FIG. 7. Current $I_{SLEW}$ is proportional to $v_{REF}$ and $n \times G_{REF}$:

$$I_{SLEW} = v_{REF} \times n \times G_{REF},$$

where n is the ratio of transistor sizes in the current mirror and $G_{REF}$ is the conductance of the reference resistor. Thus, the digital output code may be represented as:

$$D_{OUT} = t_{IN} \frac{v_{REF}}{v_{REF,ADC}} \frac{n G_{REF}}{C_{SLEW}} 2^{N_{ADC}} + \varepsilon_q.$$

Figure 4:
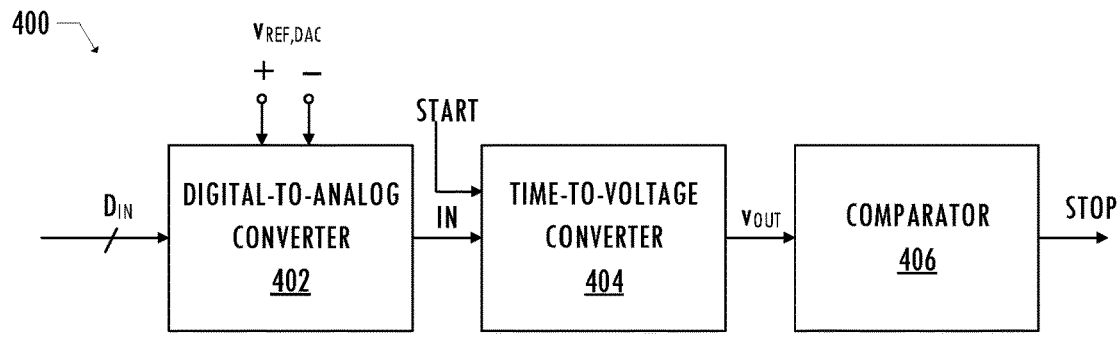
FIG. 4 illustrates a functional block diagram of a conventional digital-to-time converter.
Figure 5:
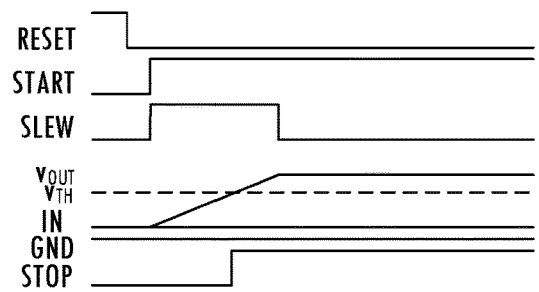
FIG. 5 illustrates exemplary waveforms for the conventional digital-to-time converter of FIG. 4.
Figure 6:
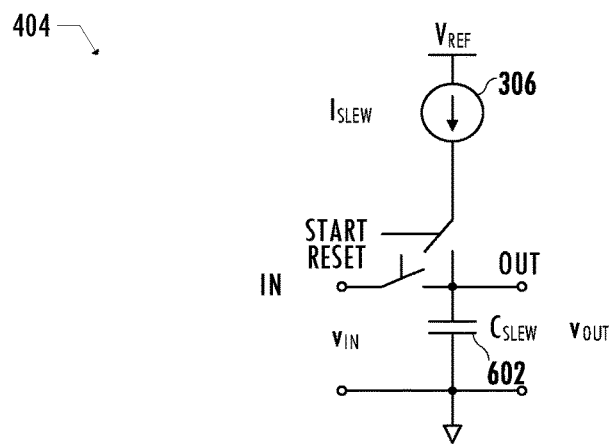
FIG. 6 illustrates a circuit diagram of an exemplary time-to-voltage converter of the conventional digital-to-time converter of FIG. 4.

As a result, the gain of the time-to-digital converter 100 of FIGS. 1-3 is defined by a voltage ratio $$\left(\frac{v_{REF}}{v_{REF,ADC}}\right),$$

a resistor-capacitor component ratio $$\left(\frac{G_{REF}}{C_{SLEW}}\right),$$

and a transistor ratio (n). Similarly, the digital-to-time converter 400 of FIGS. 4-6 has a variable delay defined by $$\frac{(v_{TH} - v_{IN}) \times C_{SLEW}}{v_{REF} \times n \times G_{REF}},$$

where voltage $v_{IN}$ is the output of digital-to-analog converter 402 and $v_{TH}$ is the threshold voltage of comparator 406. As a result, the gain of digital-to-time converter 400 is also defined by a voltage ratio $$\left(\frac{v_{REF,DAC}}{v_{REF}}\right),$$

a resistor-capacitor component ratio $$\left(\frac{C_{SLEW}}{G_{REF}}\right),$$

and a transistor ratio (1/n). The voltages of the voltage ratios of time-to-digital converter 100 of FIGS. 1-3 and digital-to-time converter 400 of FIGS. 4-6 may be matched using conventional circuit techniques. However, integrated circuit resistors are not easily matched to integrated circuit capacitors by conventional techniques and noise and mismatch of the transistors in the current mirror can cause inaccuracy.

A time-to-voltage converter using correlated double sampling of a current generates the output voltage using a capacitor in response to the input interval and generates a correlated reference voltage using a predetermined reference interval and a second capacitor. The two different capacitors sample the output of the same current source to reduce or eliminate effects of the current source. The time-to-voltage converter provides that correlated reference voltage to a related circuit. Use of the correlated voltage reference in the related circuit increases gain accuracy and reduces or eliminates flicker noise in time-to-digital converters and digital-to-time converters by eliminating the gain dependence on one or more of a voltage ratio, resistor-capacitor component ratio, and/or the transistor ratio described above for conventional time-to-digital converters and digital-to-time converters. Inclusion of those time-to-digital converters and digital-to-time converters in timing circuits (e.g., fractional frequency counters and interpolative dividers) that use the output voltage and correlated voltage reference have improved close-in phase noise and deterministic jitter. The time-to-digital converters and digital-to-time converters that implement a time-to-voltage converter using correlated double sampling voltage reference generation have increased modularity, resulting in less complex systems.

Figure 8:
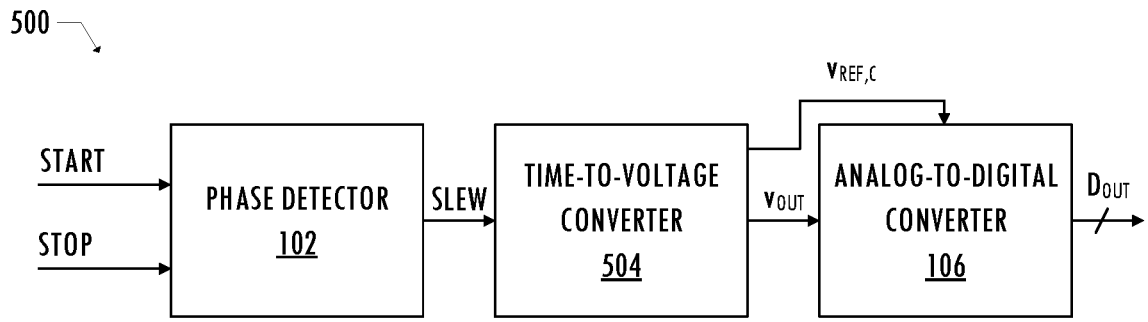
FIG. 8 illustrates a functional block diagram of an exemplary time-to-digital converter including a time-to-voltage converter using correlated double sampling consistent with at least one embodiment of the invention.
Figure 9:
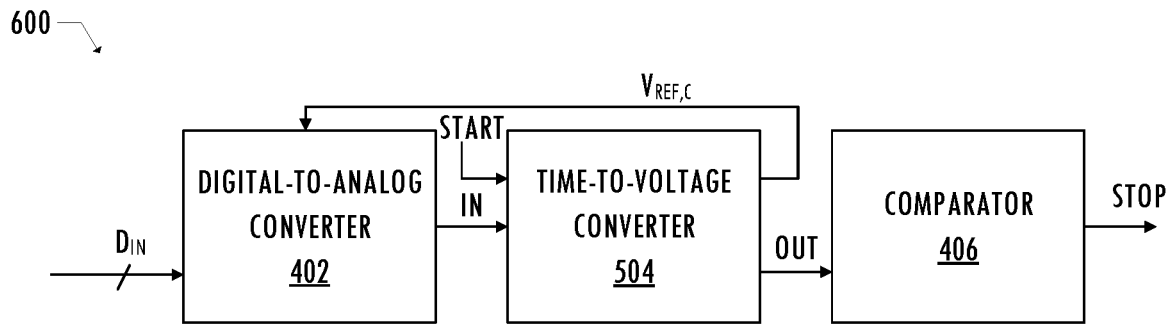
FIG. 9 illustrates a functional block diagram of an exemplary digital-to-time converter including a time-to-voltage converter using correlated double sampling consistent with at least one embodiment of the invention.

Referring to FIG. 8, time-to-digital converter 500 includes time-to-voltage converter 504, which generates correlated reference voltage $v_{REF,C}$ using correlated double sampling and provides the correlated reference voltage $v_{REF,C}$ to analog-to-digital converter 106. Referring to FIG. 9, digital-to-time converter 600, includes time-to-voltage converter 504, which generates correlated reference voltage $v_{REF,C}$ using correlated double sampling and provides the correlated reference voltage $v_{REF,C}$ to digital-to-analog converter 402.

Figure 10:
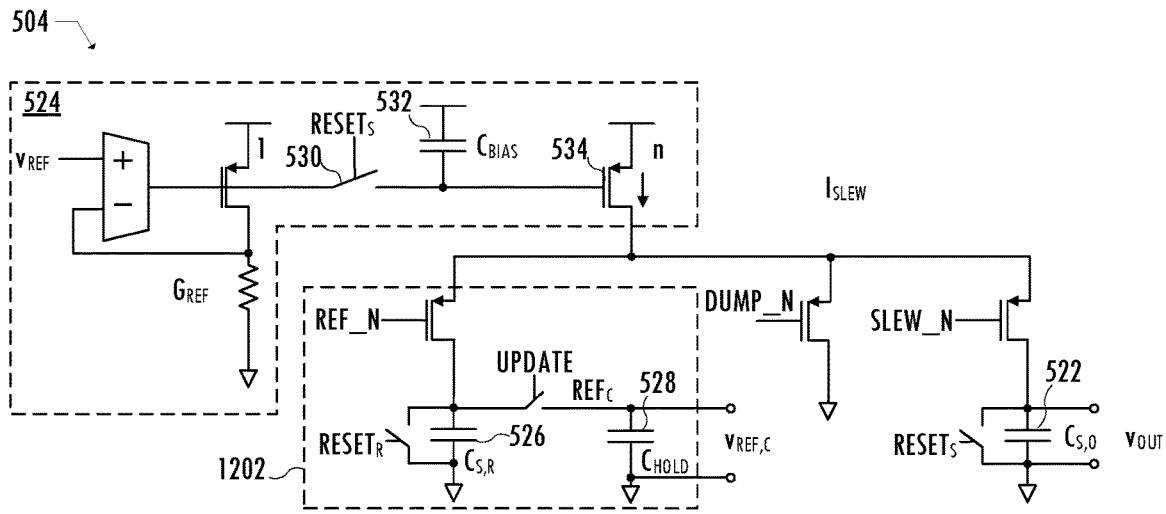
FIG. 10 illustrates a circuit diagram of an exemplary time-to-voltage converter using correlated double sampling consistent with at least one embodiment of the invention.
Figure 11:
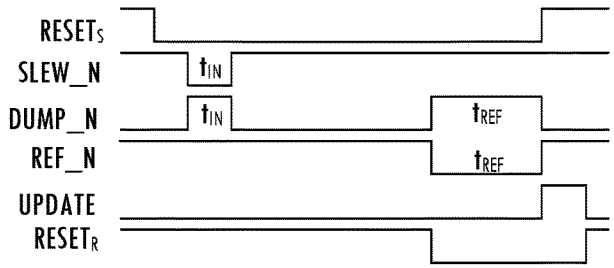
FIG. 11 illustrates exemplary waveforms for the time-to-voltage converter using correlated double sampling of FIG. 10.

Referring to FIGS. 10 and 11, time-to-voltage converter 504 includes correlated reference voltage generator 1202, which generates correlated reference voltage $v_{REF,C}$. On average, correlated reference voltage $v_{REF,C}$, tracks the effects of current source variations on voltage $v_{OUT}$. During a first reset interval (e.g., RESET$_S$='1' and DUMP_N='0'), capacitor 522 discharges to a reset voltage (e.g., 0 V). During a first charging interval (e.g., SLEW_N='0'), time-to-voltage converter 504 charges capacitor 522 using current $I_{SLEW}$ provided by current source 524 to cause voltage $v_{OUT}$ across capacitor 522 to increase linearly with time. After the first charging interval, capacitor 522 holds the charge. During a second reset interval (e.g., RESET$_R$='1'), capacitor 526 discharges to the reset voltage (e.g., 0 V). During a second charging interval (e.g., REF_N=='0'), time-to-voltage converter 504 charges capacitor 526 using current source 524, which causes a voltage across capacitor 526 to increase linearly with time. During an update interval after the second charging interval (e.g., UPDATE=='1'), correlated reference voltage generator 1202 couples capacitor 526 to capacitor 528 and updates the voltage on $REF_C$ according to the latest sample of current $I_{SLEW}$. Capacitor 528 holds correlated reference voltage $v_{REF,C}$, which, on average, tracks variations in current $I_{SLEW}$. As a result, correlated reference voltage $v_{REF,C}$ tracks non-ideal behavior of current $I_{SLEW}$ that also affects the voltage $v_{OUT}$. During an interval in which neither capacitor 522 nor capacitor 526 charges, charge provided by current source 524 is dumped to ground. After updating capacitor 528 (REF_N=='1' and RESET=='1'), capacitor 526 dumps charge to ground in preparation for the next reference interval. Note that in other embodiments, reference interval $t_{REF}$ may occur before input interval $t_{IN}$ and correlated reference voltage generator 1202 samples current $I_{SLEW}$ to generate correlated reference voltage $v_{REF,C}$ before time-to-voltage converter 504 samples current $I_{SLEW}$ to generate voltage $v_{OUT}$. Note that time interval $t_{IN}$ and reference interval $t_{REF}$ are non-overlapping intervals. Switch 530 and capacitor 532 reduce data dependent current modulation due to charge that is injected back to the gate node of transistor 534 and allow the current to return to ground.

Signal DUMP_N and signal REF_N include a reference interval $t_{REF}$, which is generated using a predetermined number $N_{REF}$ of periods of a precise reference clock having period $T_{VCO}$:

$$t_{REF} = N_{REF} \times T_{VCO}.$$

The precise reference clock may be a well-defined voltage-controlled oscillator clock signal that tracks a crystal oscillator or LC oscillator (e.g., +/−100 ppm) and may be otherwise available in the system. For example, reference interval $t_{REF}$ is a precise time pulse generated from eight or 16 periods of an LC oscillator output signal. An exemplary reference interval $t_{REF}$ is 10 ns, which is much greater (e.g., at least two orders of magnitude greater) than input interval $t_{IN}$ being converted (e.g., 10 ps). The resulting correlated reference voltage $v_{REF,C}$ varies as a function of reference interval $t_{REF}$:

$$v_{REF,C} = \frac{I_S}{C_{S,R}} t_{REF}.$$

Thus, the digital output code generated by a time-to-digital converter that uses correlated reference voltage $v_{REF,C}$ generated by time-to-voltage converter 504 as the reference voltage for the analog-to-digital converter may be represented as:

$$D_{OUT} = \frac{t_{IN}}{t_{REF}} \frac{C_{S,R}}{C_{S,O}} 2^{N_{ADC}} + \varepsilon_q.$$

Digital output code $D_{OUT}$ generated using correlated reference voltage $v_{REF,C}$ and provided by time-to-voltage converter 504 as the reference voltage for the analog-to-digital converter, is well-behaved and has reduced (e.g., negligible) low-frequency bias noise. However, voltage $v_{OUT}$, generated by time-to-voltage converter 504, varies as a function of the period of reference interval $t_{REF}$ and may be limited to a narrow frequency range to obtain target performance, which may be unacceptable in some applications.

Figure 12:
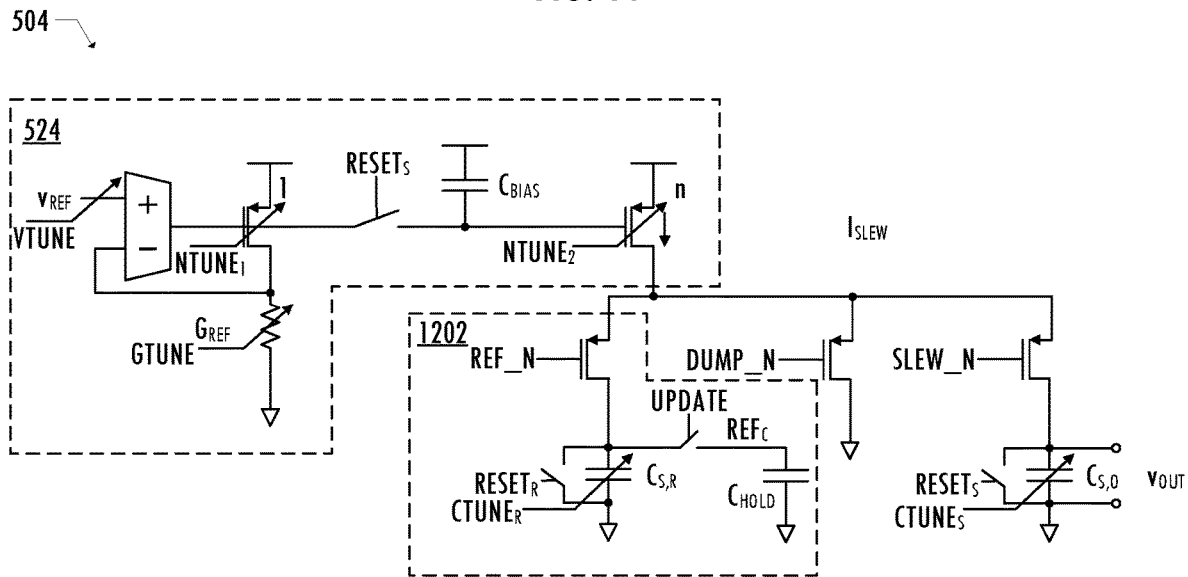
FIG. 12 illustrates a circuit diagram of an exemplary time-to-voltage converter using correlated double sampling and including tuning control consistent with at least one embodiment of the invention.

Referring to FIG. 12, in at least one embodiment, time-to-voltage converter 504 is tunable to facilitate compensation for variations that may be characterized during production test. A state machine included on-chip or off-chip may determine values of VTUNE, GTUNE, $NTUNE_1$, $NTUNE_2$, $CTUNE_R$, and $CTUNE_S$ that may be stored in non-volatile memory for use in steady-state operation. Reference voltage $v_{REF}$ may be selected to adjust the voltage headroom of time-to-voltage converter 504. Reference interval $t_{REF}$ may be selected using coarse control or by using a high-speed counter for $N_{REF}$ to implement finer control at the expense of increased power consumption. Values of VTUNE, GTUNE, $NTUNE_1$, $NTUNE_2$, $CTUNE_R$, and $CTUNE_S$ adjust values of reference voltage $v_{REF}$, transconductance $G_{REF}$, capacitance $C_{S,R}$, and capacitance $C_{S,O}$, respectively, to obtain a target slew rate of time-to-voltage converter 504.

Figure 13:
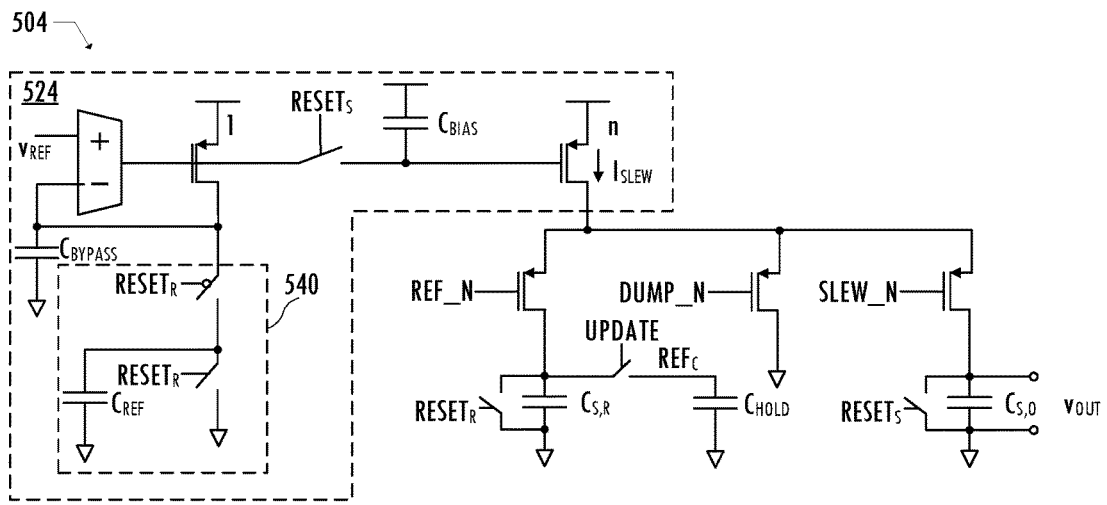
FIG. 13 illustrates a circuit diagram of an exemplary time-to-voltage converter using correlated double sampling with an extended frequency range consistent with at least one embodiment of the invention.

Referring to FIG. 13, in at least one embodiment of time-to-voltage converter 504, current source 524 includes switched-capacitor resistor load 540 instead of a voltage-to-current conversion circuit. Switched-capacitor resistor load 540 extends the frequency range of operation, as compared to embodiments of current source 524 that include a voltage-to-current conversion circuit. As a result, current $I_{SLEW}$ varies as a function of input period $T_{IN}$, where $T_{IN}$ is the rate at which start edges arrive at the time-to-voltage converter 504 and may coincide with the period of $RESET_R$. Accordingly, $$I_{SLEW} = \frac{V_{REF} \times n \times C_{REF}}{T_{IN}}, \text{ and}$$

$$v_{REF,C} = v_{REF} \frac{n \times C_{REF} \times t_{REF}}{C_{S,R} \times T_{IN}}.$$

Thus, time-to-voltage converter 504 can be adjusted to increase headroom over a wider frequency range. Since reference voltage $v_{REF}$ varies by less than +/−5%, capacitance ratio $C_{REF}/C_{S,R}$ is fixed, and n has negligible variation as a function of temperature, a simple counter may be used to generate reference interval $t_{REF}$ and implement a fixed ratio for $t_{REF}/T_{IN}$ for a particular correlated reference voltage $v_{REF,C}$ to reduce or eliminate frequency-dependent effects. Multiple switched-capacitor resistors may be coupled in parallel and may operate in different intervals to smooth voltage ripple for operation at higher frequencies.

Figure 14:
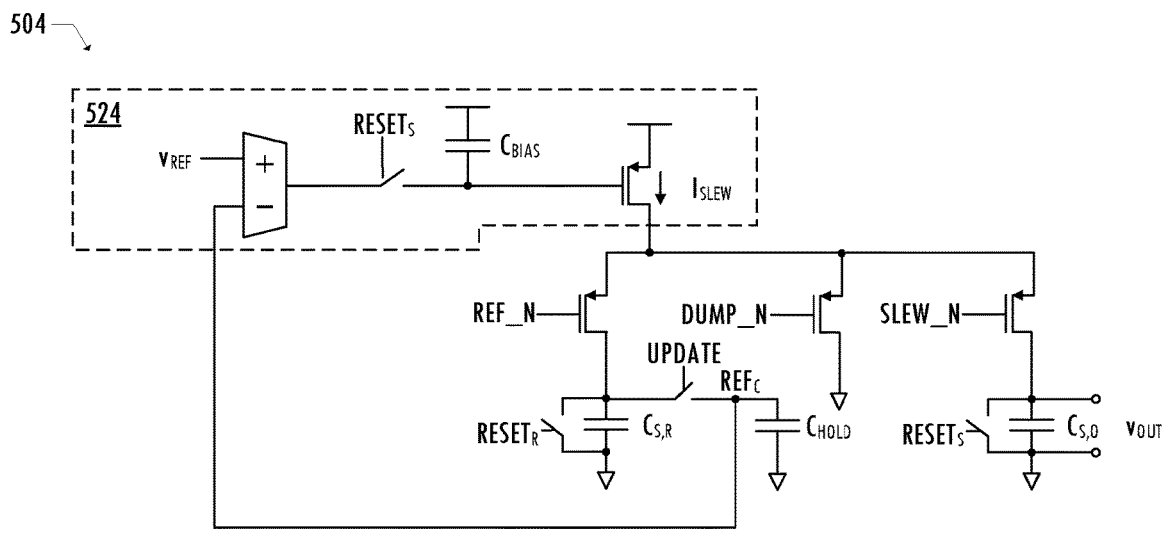
FIG. 14 illustrates a circuit diagram of an alternative embodiment of a time-to-voltage converter using correlated double sampling with an extended frequency range consistent with at least one embodiment of the invention.

Rather than using a switched-capacitor resistor load to extend the frequency range of operation, in at least one embodiment of time-to-voltage converter 504, current source 524 receives correlated reference voltage $v_{REF,C}$ as feedback, which also eliminates the current mirror and associated error (FIG. 14). The elimination of the current mirror in current source 524 simplifies time-to-voltage converter 504, reuses components, consumes less power for a target noise performance, and consumes less area of an associated integrated circuit die. Thus, the digital output code generated by a time-to-digital converter that uses correlated reference voltage $v_{REF,C}$ as the reference voltage for the analog-to-digital converter becomes:

$$D_{OUT} = \frac{t_{IN}}{t_{REF}} \frac{C_{S,R}}{C_{S,O}} 2^{N_{ADC}} + \varepsilon_q,$$

which is independent of the voltage ratio described above.

Figure 15:
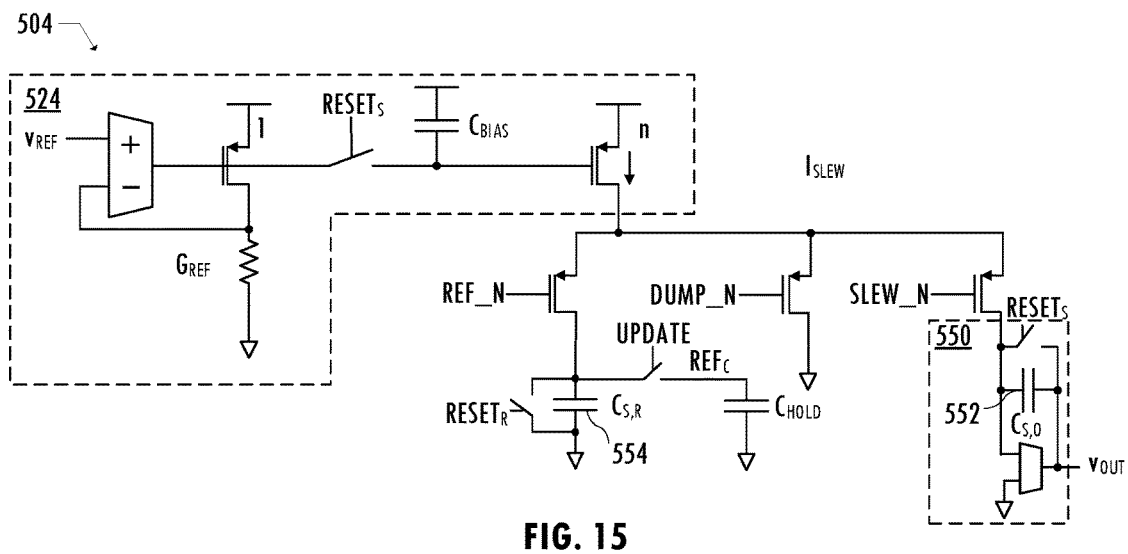
FIG. 15 illustrates a circuit diagram of an exemplary time-to-voltage converter using correlated double sampling with an extended frequency range and a capacitor configured to provide feedback consistent with at least one embodiment of the invention.

Referring to FIG. 15, in at least one embodiment, time-to-voltage converter 504 includes slewing capacitor 552 in a feedback configuration of sample-and-hold circuit 550. This configuration reduces drain-to-source modulation on the current source and improves linearity of time-to-voltage converter 504. Sample and hold circuit 550 pushes charge to a virtual ground and limits the change in voltage on the current source. In other embodiments of time-to-voltage converter 504, a similar sample-and-hold circuit is implemented for capacitor 554.

Figure 16:
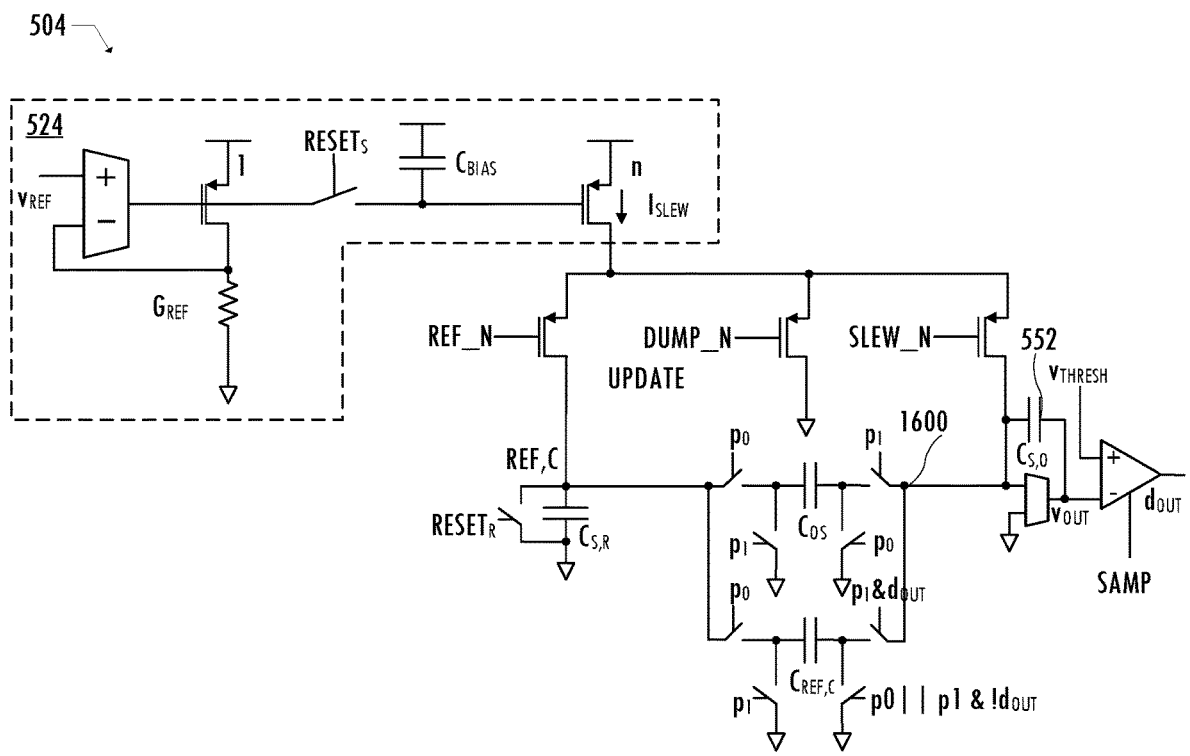
FIG. 16 illustrates a circuit diagram of an exemplary time-to-voltage converter using correlated double sampling providing a correlated reference voltage to a first order sigma-delta modulator-based digital-to-analog converter consistent with at least one embodiment of the invention.
Figure 17:
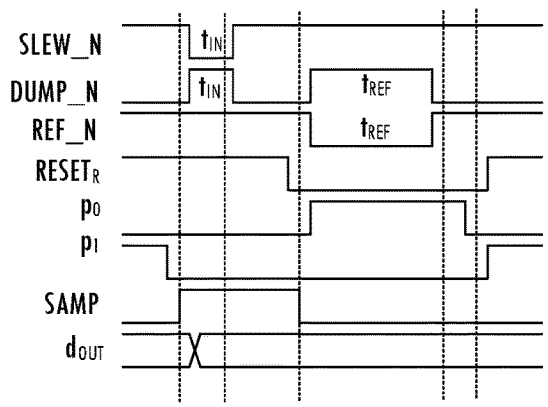
FIG. 17 illustrates exemplary waveforms for the time-to-voltage converter using correlated double sampling and the first order sigma-delta modulator-based digital-to-analog converter of FIG. 16.

Referring to FIGS. 16 and 17, in an exemplary time-to-digital converter application, the analog-to-digital converter 106 uses first order sigma-delta modulation. The first order sigma delta modulator eliminates the reset switch and does not reset capacitor 552, but rather stores a residue used in noise shaping. Capacitors $C_{S,R}$, $C_{REF,C}$, and $C_{OS}$, are used to generate correlated reference voltage $v_{REF,C}$, where node REF,C is at the top plate of capacitor $C_{S,R}$, when capacitors $C_{S,R}$, $C_{REF,C}$, and $C_{OS}$, are coupled in parallel during reference interval $t_{REF}$. Thus, capacitors $C_{REF,C}$, and $C_{OS}$ sample voltage $v_{REF,C}$. Assuming instantaneous on and instantaneous off (i.e., $t_{ON}=0$ and $t_{OFF}=0$) of switches responsive to SLEW_N and REF_N, the input charge delivered by current source 524 is:

$$Q_{IN} = t_{IN} \times I_{SLEW},$$

where $t_{IN}$ is the input interval of signal SLEW_N and signal DUMP_N. The output switched-capacitor charge injected into virtual ground by $C_{OS}$ and $C_{REF,C}$ is:

$$Q_{OUT} = -(d_{OUT}C_{REF,C} + C_{OS})v_{REF,C}.$$

Digital output signal $d_{OUT}$ is a digital bit stream such that $d_{OUT} \in [1,0]$, and the correlated reference voltage $v_{REF,C}$ is:

$$v_{REF,C} = t_{REF} \frac{I_{SLEW}}{C_{S,R} + C_{OS} + C_{REF,C}} = t_{REF} \frac{I_{SLEW}}{C_{S,TOTAL}},$$

where $t_{REF}$ is the reference interval of signal REF_N and signal DUMP_N and $C_{TOTAL}$ is the total capacitance configured in parallel when delivering charge to node 1600. Average output charge $\langle Q_{OUT} \rangle$ equals input charge $Q_{IN}$, thus the average digital output signal is defined by the following relationship:

$$\langle d_{OUT} \rangle = \frac{t_{IN}}{t_{REF}} \frac{C_{S,TOTAL}}{C_{REF,C}} - \frac{C_{OS}}{C_{REF,C}},$$

where $$C_{S,R} = C_{S,TOTAL} \frac{Q_{S,R}}{Q_{REF}},$$

$$C_{OS} = C_{S,TOTAL} \frac{Q_{OS}}{Q_{REF}}, \text{ and}$$

$$C_{REF,C} = C_{S,TOTAL} \frac{Q_{FS}}{Q_{REF}},$$

and $Q_{REF}$ is the total charge delivered by current $I_{SLEW}$ to node REF,C during reference interval $t_{REF}$. Different charge delivery intervals based on the reference interval $t_{REF}$ correspond to each of the capacitors and each of the capacitors holds a different amount of charge according to size. In general, charge Q equals current I times interval of current delivery t (i.e., $Q = t \times I$), and $$\frac{Q_1}{Q_2} = \frac{t_1 \times I}{t_2 \times I} = \frac{t_1}{t_2}.$$

Accordingly, the average digital output signal is defined by the following relationship:

$$\langle d_{OUT} \rangle = \frac{t_{IN} - t_{OS}}{t_{FS}},$$

where $$t_{OS} = t_{REF} \times \frac{Q_{OS}}{Q_{REF}}, t_{FS} = t_{REF} \times \frac{Q_{FS}}{Q_{REF}}, t_{IN} \geq t_{OS},$$

$t_{FS}$ is the full-scale time (e.g., the total input time range of an associated time-to-digital converter or the total output time range supported by an associated digital-to-time converter), and $Q_{FS}$ is the full-scale charge in the charge domain (e.g., the maximum amount of charge that can be removed from the virtual ground in each conversion cycle of a comparator of an associated sigma-delta modulator).

Figure 18:
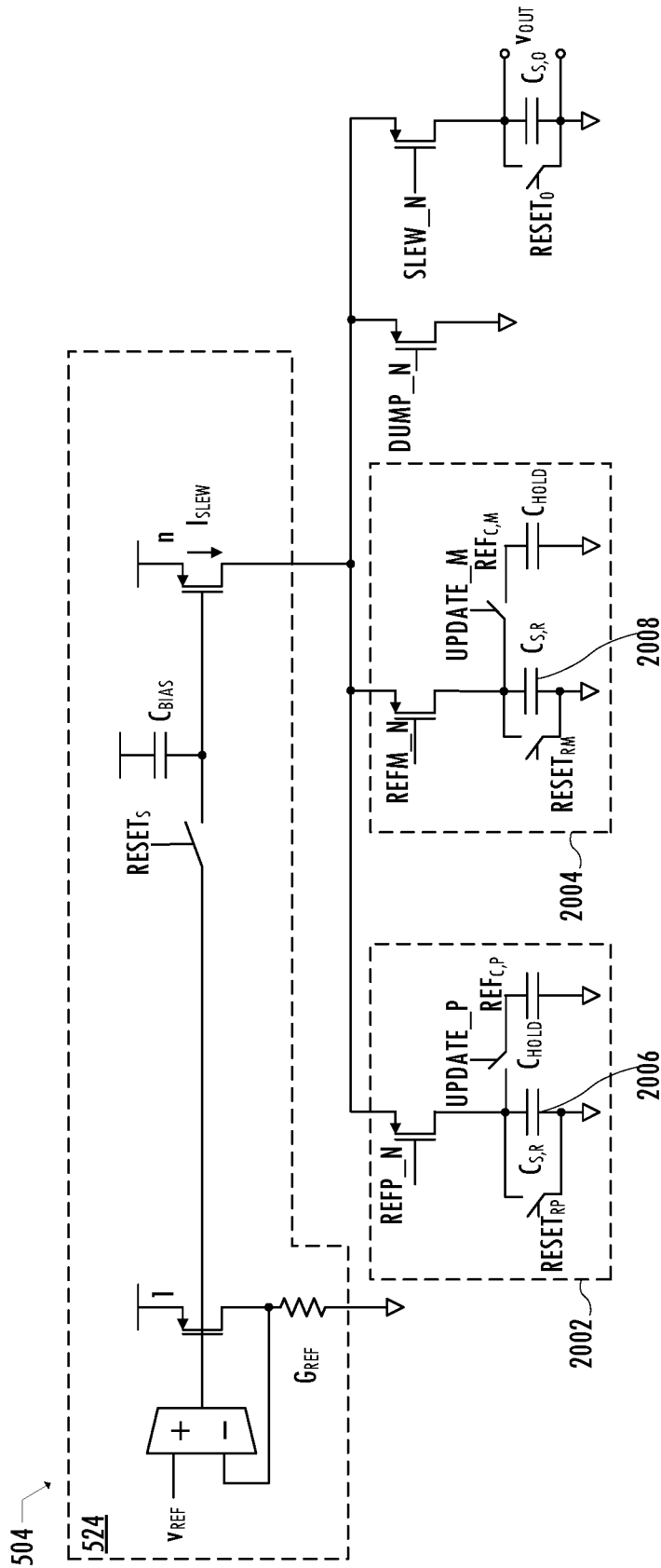
FIG. 18 illustrates a circuit diagram of an exemplary time-to-voltage converter using correlated double sampling with transient neutralization consistent with at least one embodiment of the invention.
Figure 19:
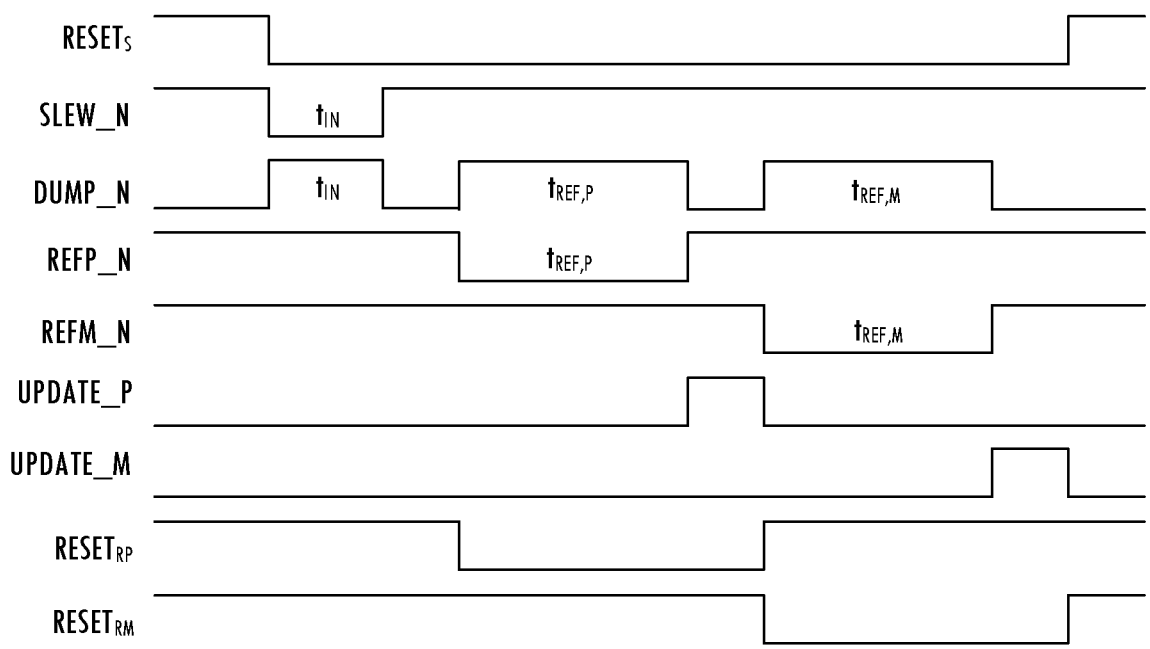
FIG. 19 illustrates exemplary waveforms for the time-to-voltage converter using correlated double sampling with transient neutralization of FIG. 18.

Note that in practice, $t_{ON}$ and $t_{OFF}$ are not instantaneous, but rather have non-zero values (i.e., $t_{ON}>0$ and $t_{OFF}>0$), which contribute to nonlinearity in the output of the time-to-voltage converter. Referring to FIGS. 18 and 19, in at least one embodiment, time-to-voltage converter reduces or eliminates those contributions to non-linearity by using multiple correlated reference voltage generators. Correlated reference voltage generator 2002 and correlated reference voltage generator 2004 establish correlated reference voltage $v_{REF,C,P}$ and correlated reference voltage $v_{REF,C,M}$, in response to signal $RESET_{R,P}$ associated with an equivalent reference interval $t_{REF,P}$ and signal $RESET_{R,M}$ associated with an equivalent reference interval $t_{REF,M}$. Note that input interval $t_{IN}$, reference interval $t_{REF,P}$, and reference interval $t_{REF,P}$ are non-overlapping intervals. Capacitor 2006 and capacitor 2008 charge during different reference intervals, which reduces the time requirements. The switched current sources require a turn-on/turn-off time before charge is delivered at approximately a constant rate (i.e., linear ramping) to slewing capacitor $C_{S,O}$. Neutralization of the turn-on/turn-off transients due to current switching requires two separate measurements, one for correlated reference voltage $v_{REF,C,P}$, and one for correlated reference voltage $v_{REF,C,M}$, each measurement including the turn-on/turn-off transients. The turn-on/turn-off transients neutralize each other:

$$t_{REF,P} = \left[N_P - \frac{t_{ON} + t_{OFF}}{2 \times T_{VCO}}\right] \times T_{VCO},$$

$$t_{REF,M} = \left[N_M - \frac{t_{ON} + t_{OFF}}{2 \times T_{VCO}}\right] \times T_{VCO},$$

and $$t_{REF} = t_{REF,P} - t_{REF,M} = (N_P - N_M) \times T_{VCO}.$$

Supplying correlated reference voltage $v_{REF,C,P}$ and correlated reference voltage $v_{REF,C,M}$ to a positive reference voltage terminal and a negative reference voltage terminal of analog-to-digital converter 106 of time-to-digital converter 500 of FIG. 8 or to digital-to-analog converter 402 of digital-to-time converter 600 of FIG. 9, neutralizes (i.e., reduce or eliminate) the edge effects and improves system linearity.

Figure 20:
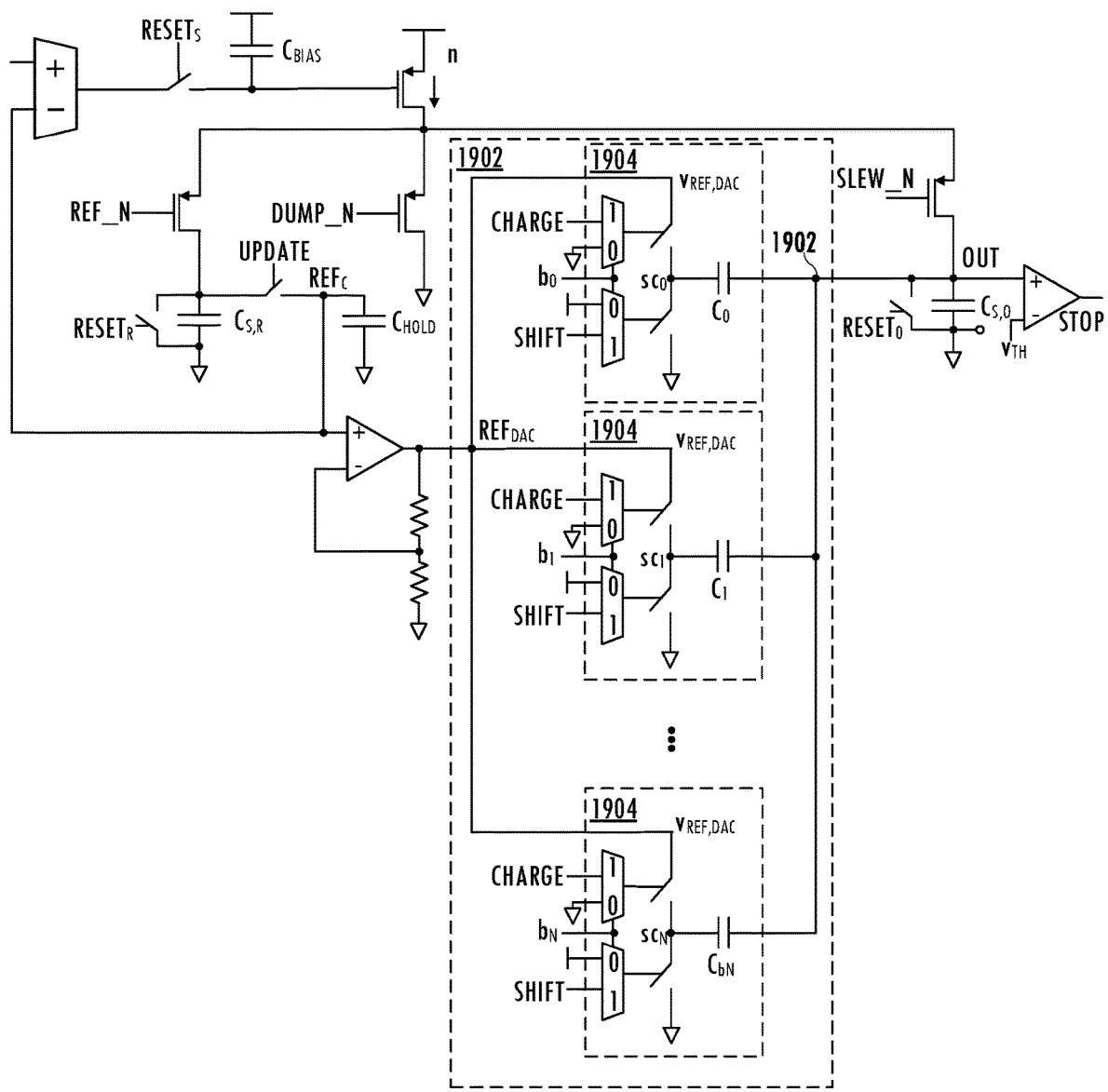
FIG. 20 illustrates a circuit diagram of an exemplary time-to-voltage converter using correlated double sampling providing a correlated reference voltage to a capacitive digital-to-analog converter consistent with at least one embodiment of the invention.
Figure 21:
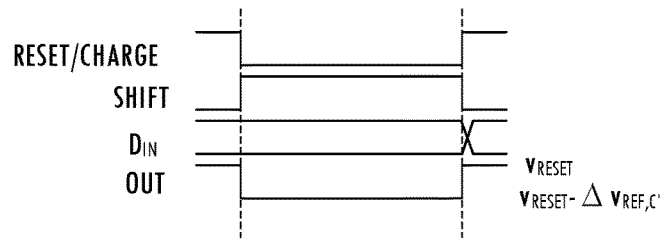
FIG. 21 illustrates exemplary waveforms for the time-to-voltage converter and capacitive digital-to-analog converter of FIG. 20.

FIGS. 20 and 21 illustrate a conventional capacitive digital-to-analog converter responsive to correlated reference voltage $v_{REF,C}$. Capacitive digital-to-analog converter 1902 receives an input digital code having N input bits (e.g., $b_0, b_1, b_2, \ldots, b_N$), where N is an integer greater than or equal to one. Capacitive digital-to-analog converter 1902 includes a capacitive digital-to-analog converter (e.g., capacitive bit cell 1904) for each bit of the N bits of input digital code $D_{IN}$. Each capacitive bit cell 1904 receives $v_{REF,DAC}$, which is generated based on correlated voltage reference $v_{REF,C}$. During a reset interval, capacitive digital-to-analog converter 1902 charges the voltage on node 1920 to the same, predetermined reset voltage level. In response to de-assertion of the reset control signal, capacitive digital-to-analog converter 1902 applies a shift voltage to node 1920 according to digital control word $D_{IN}$.

Capacitive digital-to-analog converter 1902 selectively enables each bit cell according to a corresponding input bit $b_n$. If $b_n$ has a low logic value (i.e., $b_n$=='0'), then capacitive bit cell 1904 provides constant signals to decouple the capacitive bit cell from the positive voltage reference and couple the capacitive bit cell to ground, thereby discharging the switched-capacitor node.

If $b_n$ has a high logic value (i.e., $b_n$=='1'), then capacitive bit cell 1904 provides the charge control signal to selectively couple the switched-capacitor node $sc_n$ to the positive voltage reference node and provides the shift control signal to selectively couple the switched-capacitor node $sc_n$ to the negative voltage reference node. The charge control signal and the shift control signal charge switched-capacitor node $sc_n$ to voltage $v_{REF,DAC}$ in a first interval (CHARGE=='1' and SHIFT=='0'), thereby pre-charging switched-capacitor node $sc_n$ to a pre-charge voltage. During a second interval, the charge control signal and the shift control signal (CHARGE=='0' and SHIFT=='1') shift the voltage on switched-capacitor node $sc_n$ to a second voltage $$v_{RESET} - \Delta v_{REF,DAC}',$$

where $\Delta v_{REF,DAC}' = (v_{REF,DAC}) \times C_T/(C_T + C_{OUT})$ and $C_T$ is the sum of capacitances $C_n$ for each bit cell having $b_n$=='1'. As a result, voltage $v_{OUT,DAC}$ becomes $v_{RESET} - \Delta v_{REF,DAC}'$, which is an analog value corresponding to the value of DIN and based on $v_{REF,C}$. Since the output voltage of the capacitive digital-to-analog converter on node 1920, voltage $v_{OUT,DAC}$, is generated using correlated voltage reference $v_{REF,C}$, the output signal, used to generate output time signal STOP has improved gain accuracy and negligible by eliminating the gain dependence on one or more of the voltage ratio, resistor-capacitor component ratio, and/or the transistor ratio described above for digital-to-time converters.

Thus, correlated double sampling techniques for generating a correlated reference voltage in a time-to-voltage converter have been described. The correlated reference voltage $v_{REF,C}$ (or correlated reference voltage $v_{REF,C,M}$ and correlated reference voltage $v_{REF,C,P}$) generated as described above can be provided as the reference voltage to analog-to-digital converter 106 of time-to-digital converter 500 of FIG. 10 or digital-to-analog converter 402 of digital-to-time converter 600 of FIG. 11 to improve linearity and performance of those signal converters including a time-to-voltage converter.

The description of the invention set forth herein is illustrative and is not intended to limit the scope of the invention as set forth in the following claims. For example, while the invention has been described in an embodiment in which a sigma-delta analog-to-digital converter and a capacitor digital-to-analog converter are used, one of skill in the art will appreciate that the teachings herein can be utilized with other types of analog-to-digital converters, other types of digital-to-analog converters, or other companion circuits are used with the correlated reference voltage. In addition, other time-to-voltage converters that use correlated double sampling to generate a correlated reference voltage consistent with the invention have different reset voltage levels, discharge a capacitor from the reset voltage level, and may generate an output signal that is linearly related to a time delay between a falling edge of the control signal and a rising edge of the control signal. Variations and modifications of the embodiments disclosed herein, may be made based on the description set forth herein, without departing from the scope of the invention as set forth in the following claims.

What is claimed is:

1. An apparatus comprising:
   a time-to-voltage converter configured to generate an output voltage signal and a correlated reference voltage signal,
   wherein the time-to-voltage converter comprises:
      a current source configured to generate a bias current through a current source output node;
      a first switched-capacitor circuit coupled to the current source output node and configured to generate the output voltage signal based on an input time signal and the bias current during a first interval; and
      a second switched-capacitor circuit coupled to the current source output node and configured to generate the correlated reference voltage signal based on a reference time signal and the bias current during a second interval, the first interval and the second interval being non-overlapping intervals.

2. The apparatus, as recited in claim 1, wherein the second switched-capacitor circuit comprises:
   a reference capacitor configured to sample the current source output node to develop a reference voltage during the second interval; and
   a hold capacitor selectively coupled in parallel with the reference capacitor and configured to hold the reference voltage outside the second interval.

3. The apparatus, as recited in claim 1, further comprising:
   a third switched-capacitor circuit configured to generate a second correlated reference voltage signal based on a second reference time signal and the bias current during a third interval, the third interval and the second interval being non-overlapping intervals; and
   a differential pair of reference voltage terminals, a positive terminal of the differential pair of reference voltage terminals coupled to receive the correlated reference voltage signal and a negative terminal of the differential pair of reference voltage terminals coupled to receive the second correlated reference voltage signal to provide transient voltage neutralization in a circuit coupled to the differential pair of reference voltage terminals.

4. The apparatus, as recited in claim 1, wherein the output voltage signal has a selectable slew rate.

5. The apparatus, as recited in claim 1, wherein the current source comprises:

a switched-capacitor circuit; and
a voltage-to-current converter configured to generate an output current based on a reference voltage signal and a feedback signal.

6. The apparatus, as recited in claim 5, wherein the current source further comprises:
a switched-capacitor resistor configured to vary the bias current as a function of an input period, the switched-capacitor resistor being coupled to a first node, the feedback signal being based on a current through the first node.

7. The apparatus, as recited in claim 5, wherein the feedback signal is the correlated reference voltage signal.

8. The apparatus, as recited in claim 1, wherein the first switched-capacitor circuit comprises:
a voltage-to-current converter configured to generate an output current based on a reference voltage signal and a feedback signal.

9. The apparatus, as recited in claim 1, wherein the time-to-voltage converter is configured as part of a first order sigma-delta modulator-based time-to-digital converter and the first switched-capacitor circuit includes a capacitor that stores a residue charge.

10. The apparatus, as recited in claim 1, further comprising:
a phase detector configured to generate the input time signal indicative of an input interval; and
an analog-to-digital converter configured to generate a digital code corresponding to the output voltage signal using the correlated reference voltage signal,
wherein the phase detector, the time-to-voltage converter, and the analog-to-digital converter are configured as a time-to-digital converter.

11. The apparatus, as recited in claim 1, further comprising:
a digital-to-analog converter configured to use the correlated reference voltage signal to generate the input time signal in response to an input digital code and the reference time signal; and
a comparator configured to generate an output time signal in response to a comparison of the output voltage signal and a threshold voltage level of the comparator,
wherein the time-to-voltage converter, the digital-to-analog converter, and the comparator are configured as a digital-to-time converter.

12. A method comprising:
generating a bias current;
generating an output voltage signal that is linearly related to an input time signal based on the bias current during a first interval; and
generating a correlated reference voltage signal, generation of the correlated reference voltage signal comprising:
sampling the bias current during a second interval to generate a bias current sample; and
updating the correlated reference voltage signal using the bias current sample to generate the correlated reference voltage signal,
wherein the first interval and the second interval are non-overlapping periodic intervals of a periodic signal.

13. The method, as recited in claim 12, further comprising:
converting an input interval between a time representation and a digital signal representation based on the output voltage signal and the correlated reference voltage signal.

14. The method, as recited in claim 12, further comprising:
generating a second correlated reference voltage signal, generation of the second correlated reference voltage signal comprising:
sampling the bias current during a third interval of the periodic signal to generate the second correlated reference voltage signal; and
holding the second correlated reference voltage signal outside the third interval.

15. The method, as recited in claim 12, further comprising:
generating a second correlated reference voltage signal that is linearly related to a second reference time signal based on the bias current; and
neutralizing transient voltages in a circuit by providing the correlated reference voltage signal and the second correlated reference voltage signal to a differential pair of reference voltage terminals of the circuit, a positive terminal of the differential pair of reference voltage terminals coupled to receive the correlated reference voltage signal and a negative terminal of the differential pair of reference voltage terminals coupled to receive the second correlated reference voltage signal.

16. The method, as recited in claim 12, wherein generating the bias current comprises:
converting a reference voltage to an output current based on a feedback signal.

17. The method, as recited in claim 16, wherein generating the bias current further comprises:
varying the bias current and the feedback signal as a function of an input period.

18. The method, as recited in claim 16, wherein the feedback signal is the correlated reference voltage signal.

19. The method, as recited in claim 12, wherein generating the correlated reference voltage signal further comprises:
generating an output current based on a reference voltage signal and a feedback signal.

20. A data converter comprising:
a time-to-voltage converter configured to generate an output voltage signal in response to an input interval and configured to generate a correlated reference voltage signal in response to a reference interval,
wherein the data converter is a time-to-digital converter or a digital-to-time converter,
wherein if the data converter is the time-to-digital converter, the data converter further comprises:
a phase detector configured to generate the input interval in response to a first input signal and a second input signal; and
an analog-to-digital converter configured to generate a digital code corresponding to the output voltage signal using the correlated reference voltage signal, and
wherein if the data converter is the digital-to-time converter, the data converter further comprises:
a digital-to-analog converter configured to use the correlated reference voltage signal to generate the input interval in response to an input digital code and an input time signal; and
a comparator configured to generate an output time signal in response to a comparison of the output voltage signal and a threshold voltage level of the comparator.

* * * * *